United States Patent [19]
Ben-David et al.

[11] Patent Number: 5,214,990
[45] Date of Patent: Jun. 1, 1993

[54] METHOD AND SYSTEM FOR PUNCHING HOLES IN A SHEET MATERIAL

[75] Inventors: Ilan Ben-David, Petach-Tikva; Nitsan Kochavi, Nes-Ziona, both of Israel

[73] Assignee: Optrotech Ltd., Nes-Ziona, Israel

[21] Appl. No.: 863,837

[22] Filed: Apr. 6, 1992

Related U.S. Application Data

[63] Continuation-in-part of Ser. No. 673,278, Mar. 21, 1991, abandoned.

[51] Int. Cl.$^5$ ............................................... B26F 1/12
[52] U.S. Cl. ........................................ 83/13; 83/347; 83/328; 83/669; 83/658; 83/685
[58] Field of Search .............. 83/13, 346, 347, 659, 83/669, 670, 327, 328, 337, 684, 685, 658; 354/344; 355/73

[56] References Cited

U.S. PATENT DOCUMENTS

| | | | |
|---|---|---|---|
| 3,618,438 | 11/1971 | Simson | 83/669 |
| 4,273,015 | 6/1981 | Johnson | 83/670 |
| 4,358,979 | 11/1982 | Kurzbuch | 83/658 |
| 4,485,713 | 12/1984 | Dotia | 83/328 |
| 5,090,685 | 2/1992 | Danon et al. | 354/344 |

FOREIGN PATENT DOCUMENTS

| | | | |
|---|---|---|---|
| 2549937 | 5/1977 | Fed. Rep. of Germany | 83/347 |
| 2078154 | 1/1982 | United Kingdom | 83/346 |

Primary Examiner—Douglas D. Watts
Assistant Examiner—Allan M. Schrock
Attorney, Agent, or Firm—Helfgott & Karas

[57] ABSTRACT

A method and system for forming an artwork on a sheet material and punching holes therethrough while the sheet material is disposed on a working surface so that the holes are punched in precise registration with the artwork. The method comprises the steps of providing for each hole to be punched a corresponding socket in the working surface, and securing the sheet material on the working surface so as completely to overlap all of the sockets whereupon the artwork is formed on the sheet material in precise registration with a predetermined origin of the working surface. Associated with each of the sockets is a punch and block combination disposed on opposite surfaces of the sheet material, the block being formed of a softer material than the punch and having an operating surface larger than a cutting surface of the punch. For each of the punch and block combinations, the punch is aligned with the block so that the operating surface of the block completely overlaps the cutting surface of the punch, and the punch is then axially displaced relative to the block aligned therewith so as to punch a hole through the sheet material in precise registration with the artwork.

24 Claims, 4 Drawing Sheets

Fig. 1
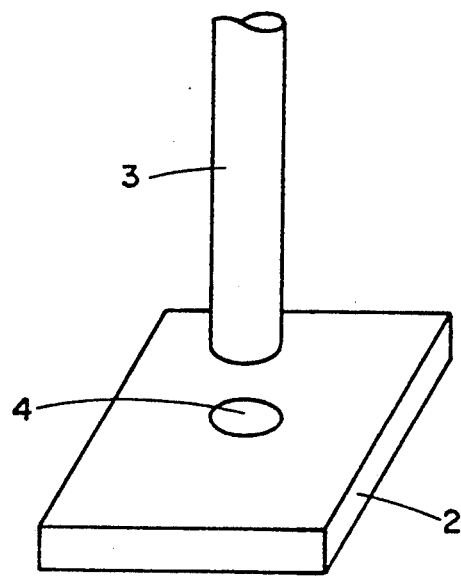
PRIOR ART
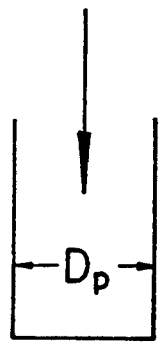
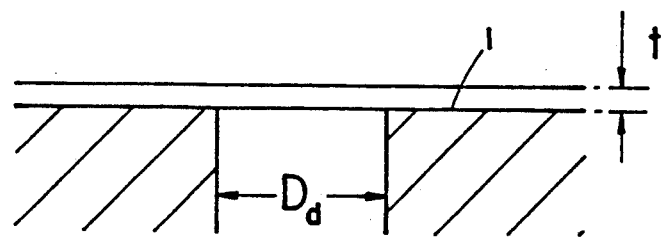
Fig. 2
PRIOR ART

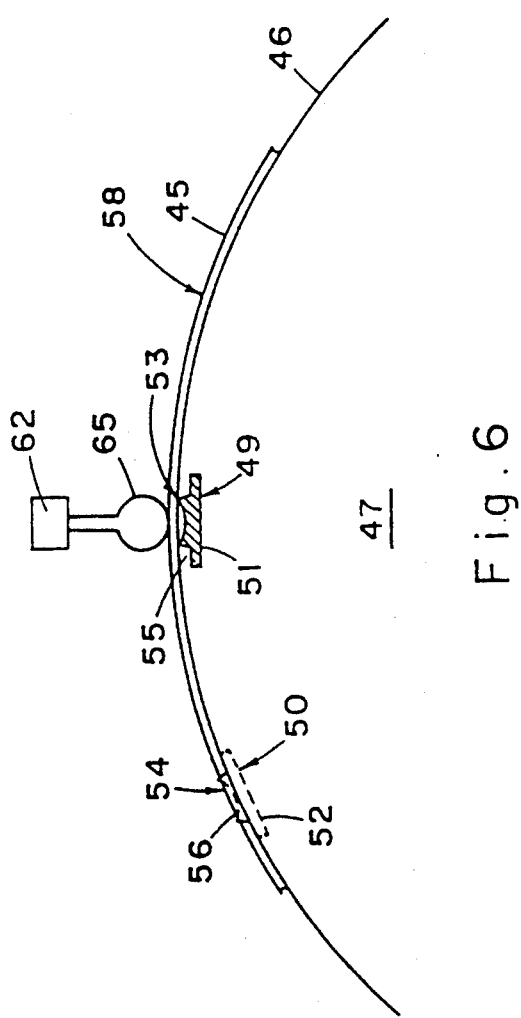

METHOD AND SYSTEM FOR PUNCHING HOLES IN A SHEET MATERIAL

RELATED APPLICATION

This is a continuation-in-part of application Ser. No. 07/673,278 filed Mar. 21, 1991 now abandoned.

FIELD OF THE INVENTION

This invention relates to a method and system for punching holes in a sheet material disposed on a working surface in precise registration therewith. In particular, the invention relates to such a method and system for use with photo-plotters permitting holes to be punched through a film material repeatably and precisely with respect to an artwork formed thereon.

BACKGROUND OF THE INVENTION

In the printed circuit board (PCB) industry, it is known to use laser plotters for exposing a photographic film so as to produce an artwork relating to a specific layer of a PCB to be manufactured. The PCB may comprise several layers each of which must be aligned precisely with respect to one another. Since each layer relates to a specific artwork, the photographic films which correspond to each of the layers must themselves be aligned in precise registration.

Such registration is achieved by punching holes in the photographic film in precise registration with the holes of other films relating to other layers of the same PCB. The exposed film bearing the artwork for each layer is registered on a surface having corresponding registration pins. Since each of the artworks is aligned with the surface in this manner, they are also aligned with respect to each other, thereby ensuring that all of the layers of the resulting PCB are in correct alignment.

Furthermore, since PCBs are mass-manufactured by employing several artworks simultaneously, it is important that the registration holes produced in the artworks are precisely aligned not only with respect to the corresponding layers of the PCB, but also with respect to each other. In other words, not only is precision required but so also is repeatability.

Several prior art methods and systems exist for punching the registration holes in the film. Thus, it is known to punch the registration holes before the film is inserted into the plotter. This, of course, is analogous to the sprocket holes produced in camera films, permitting such films to be wound on in the camera. The main drawback with such an approach is that, since the film is punched prior to exposure, the punching must be performed in a dark room.

Alternatively, the holes may be punched after the film is exposed. However, this requires the artwork to be aligned with the punching machine. Since the very purpose of the holes is to permit precise registration of successive artworks during subsequent manufacture, it is clearly unsatisfactory to employ a method which requires that the exposed film be aligned with the punching machine first in order for the registration holes to be punched. It is known to achieve such alignment automatically using electronic vision systems, but the operation is relatively slow and costly.

In order to overcome this problem, it is known, in flat bed plotters, to punch the holes in precise registration with the artwork whilst the film is on the plotter bed. There are several advantages to such an approach. First, it obviates the need for a dedicated punching machine. Secondly, the alignment is achieved automatically without the need for a costly and complicated aligning system and, thirdly, it saves time in the production process since the punching and the plotting are produced in a single stage of the manufacturing process whilst the provision of a separate punching machine clearly imposes an additional stage in the manufacturing process.

In such flat bed plotters, a conventional punch and die is provided in respect of each hole to be punched and each punch and die is pre-aligned in precise registration. The dies are formed within the surface of the plotter bed towards an edge thereof, and the punch mechanism is fixedly attached to the end of the plotter bed. In such an arrangement when the plotter bed moves so too does the punch mechanism so as to maintain the precise registration between the punch and dies.

FIGS. 1 and 2 show a conventional system for punching holes through a film 1 using a die 2 and punch 3. In this system, the punch 3 is located on one side of the film 1 and the die 2 on the other, and a hole 4 is produced by inserting the punch 3 through the film 1 into the die 2. Such a system is suitable only if the clearance between the punch 3 and the die 2 is small enough, i.e. less than 10% of the film thickness.

Thus, denoting:
t = the thickness of the film,
Dp = the diameter of the punch, and
Dd = the diameter of the die
it is required that:

$$Dd - Dp \leq 0.1t$$

When punching the registration holes in accordance with such a system, the punch, together with its actuator, is attached to the frame of the plotter and the die is located within the working surface thereof. The main disadvantage of such an approach is the very high accuracy required for aligning the punch with the die. Thus, for example, a film thickness of 100 μm requires that the tolerance of the punch location in relation to the die be at least 5 μm.

Such an arrangement is rendered feasible only because the punch mechanism is fixed to the plotter bed since, were this not the case, it would not be possible to maintain the precise registration between the punch and dies which is essential. The punch mechanism is generally robust and heavy and thus must also be effectively supported by the plotter's transport mechanism which moves the plotter bed through mutually orthogonal X and Y axes in order to align a desired co-ordinate on the film with a fixed writing head. As is known, such flat bed plotters move relatively slowly in the X and Y directions and therefore the extra mass of the punch mechanism and its consequent load on the plotter's transport mechanism can easily be tolerated.

However, this is by no means the case where drum plotters are concerned for two reasons. First, drum plotters rotate at very high speed and therefore any extra loading on the drum's transport mechanism is unacceptable. Secondly, fixing a heavy punch mechanism to a periphery of the drum would unbalance the drum and unacceptably affect the drum's dynamics.

Regardless of whether a flat bed or drum plotter is used to plot the artwork, a slight misalignment of the punch with the die not only causes inaccuracies in the resulting registration holes but, on account of the force with which the punch is inserted into the die, can damage the punch itself of even the working surface of the plotter which is made of a softer material than the punch.

U.S. Pat. NO. 4,485,713 (Dotta) discloses a punching device comprising a pair of opposed complementary dies vertically guided by a pair of guide rods each rotatably connected to a crank pin to continuously punch band material moving between the dies.

In use, a band material of paper, for example, is drawn by a pair of rollers through the gap between the opposing dies and punches whilst, at the same time, a pair of toothed wheels rotate so that the punches connected eccentrically thereto perform linear vertical to-and-fro motion along a pair of guide rods thereby successively engaging and disengaging with the dies. The dies and punches must be in exact registration with one another, this being a prerequisite of any punching machine.

By such means, holes are punched into the band material at regularly spaced intervals, depending on the traverse speed with which the band material is drawn through the device.

Furthermore, in the Dotta system, each punch finds the center of a corresponding die in much the same way that a drill bit locates a pre-formed hole or center punch. This is achieved by mounting the punches in a fluid bed so as to provide some lateral play. Thus, providing that the tip of each punch finds the center of the corresponding die, the punch can move laterally slightly in order to ensure exact alignment with the die. It is thus apparent that one of Dotta's objectives is to ensure precise alignment between the punch and die regardless of any initial fractional misalignment.

Furthermore, in the Dotta arrangement the respective dies and punches are mounted on completely planar surfaces and are axially brought into engagement and disengagement along the pair of parallel guide rods firmly connected perpendicular to the ends of one of the dies.

It will readily be apparent that the Dotta system is massive and certainly not adaptable for use with a drum plotter whose drum rotates at high speed and requires precise balancing.

German Patent No. DT 25 49 937 discloses a punch mounted on a cylindrical surface and which impacts a flexible substrate which is larger than the punch.

DT 25 49 937 obviates the need for precise alignment between the punch and die. However, there is nothing in this reference to suggest its application to a system for plotting an artwork and for punching registration holes therethrough in precise registration with the artwork. There is further no reason to combine the teachings of DT 25 49 937 with those of the Dotta system, since DT 25 49 937 actually teaches away from the teachings of Dotta in that in the Dotta system precise alignment between the punches and dies is required, whilst DT 25 49 937 obviates the need for such precise alignment.

Even apart from these considerations, neither of these references is suitable, either singly or in combination, for ensuring that the punches holes are in precise registration with an artwork previously or subsequently formed on a film material disposed on a plotter. They are merely directed to ensuring registration, or alternatively to obviating the need for such registration, between the punch and die.

U.S. Pat. No. 3,618,438 (Simson) is directed to cutting webs of sheet-like material in a web offset printing press simultaneously with the action of applying ink images to one or both sides of the web of sheet-like material.

Thus, as shown in Simson, a web of sheet-like material is fed between two interacting rollers referred to, respectively, as a blanket cylinder and an impression cylinder. A die having a protruding cutting edge is secured to the impression cylinder so that on encountering the sheet material against an opposing surface of the blanket cylinder, a section is cut out of the sheet material corresponding to the contour of the die.

Here again, there is no suggestion that the removed section of the sheet material is in a predetermined and precise registration with the sheet material itself still less, of course, with an artwork formed thereon either prior or subsequent to punching the holes.

It will be borne in mind that in plotters used in the PCB manufacturing industry, the print head is mounted in precise and known registration with respect to the working surface. Consequently, if the punches in particular are mounted within the working surface, their location must be in known and precise registration relative to the printing head. This guarantees that the holes thus punched through the artwork are in precise registration therewith since, obviously, the artwork is registered relative to a rest position of the print head. This notwithstanding, no solution has yet been proposed to providing a punch and die combination integral with the working surface of a plotter which exploits this fact and which is, at the same time, both light and amenable to application in drum plotters which have the very rigid dynamic requirements as outlined above.

SUMMARY OF THE INVENTION

It is an object of the invention to provide a method and system for punching holes in sheet material whilst disposed on a working surface, wherein at least some of the drawbacks associated with hitherto proposed methods and systems are substantially reduced or eliminated.

According to a broad aspect of the invention, there is provided in a process for forming an artwork on a sheet material, a method for punching holes in the sheet material whilst disposed on a working surface in precise registration with the artwork, the method comprising the steps of:

(a) providing for each hole to be punched a corresponding socket in said working surface, (b) securing the sheet material on the working surface so as completely to overlap all of the sockets, (c) forming the artwork on the sheet material in precise registration with a predetermined origin of the working surface, (d) associating with each of the sockets a punch and block combination disposed on opposite surfaces of the sheet material, said block being formed of a softer material than the punch and having an operating surface larger than a cutting surface of the punch, (e) for each of said punch and block combinations, aligning the punch with the block so that the operating surface of the block completely overlaps the cutting surface of the punch, and (f) effecting relative axial displacement of the punch towards the block aligned therewith so as to punch a hole through the sheet material in precise registration with the artwork.

There exist two different approaches for carrying out such a method. In both approaches, sockets are formed in the working surface of the plotter, each corresponding to a hole required to be punched and having an operating surface larger than the cutting surface of the punch.

In one system, the sockets are filled with material, such as plastics, which is relatively soft compared to the cutting surface of the punch. The punch is then brought into exact alignment with the working surface, such that the operating surface of the socket completely overlaps the cutting surface of the punch. The punch is then displaced towards the socket so as to punch a hole through the film, whilst any damage to the punch is completely avoided since the sharp corners associated with the dies in hitherto proposed methods are dispensed with. In such a system, a single punch can be provided which is successively aligned with each of the pre-formed sockets so as to punch the registration holes as required. However, although the need for high accuracy is eliminated, there still exists a repeatability problem. This problem can be overcome by employing a plurality of punches, each in respect of a corresponding hole and pre-aligned with the respective socket along at least one axis in the plane of the working surface of the plotter.

In an alternative system, a plurality of punches is again employed, but this time each being fixedly mounted within a corresponding socket in the working surface of the plotter and having a cutting surface protruding slightly above the working surface. In order to punch the holes, a block formed of a material such as aluminum, being relatively soft compared to the cutting surface of the punch and having an operating surface larger than the cutting surface of the punch, is approximately aligned with each punch in turn above the surface of the sheet material mounted on the working surface so as to completely overlap the cutting surface of the punch. The block is then displaced towards the punch under pressure, whereby a clean hole is punched through the sheet material in precise and guaranteed registration with the working surface of the plotter.

BRIEF DESCRIPTION OF THE DRAWINGS

The invention will now be described, by way of non-limiting example only, with regard to a method and system for forming an artwork and registration holes in situ on a drum plotter and with reference to the accompanying drawings, in which:

FIG. 1 shows, in perspective, a conventional system employing a punch and die;

FIG. 2 is a sectional view of the arrangement shown in FIG. 1, pointing out some of the requirements and drawbacks with hitherto proposed systems;

FIG. 6 is a pictorial representation of a third embodiment according to the invention.

DETAILED DESCRIPTION OF PREFERRED EMBODIMENTS

Figure 3:
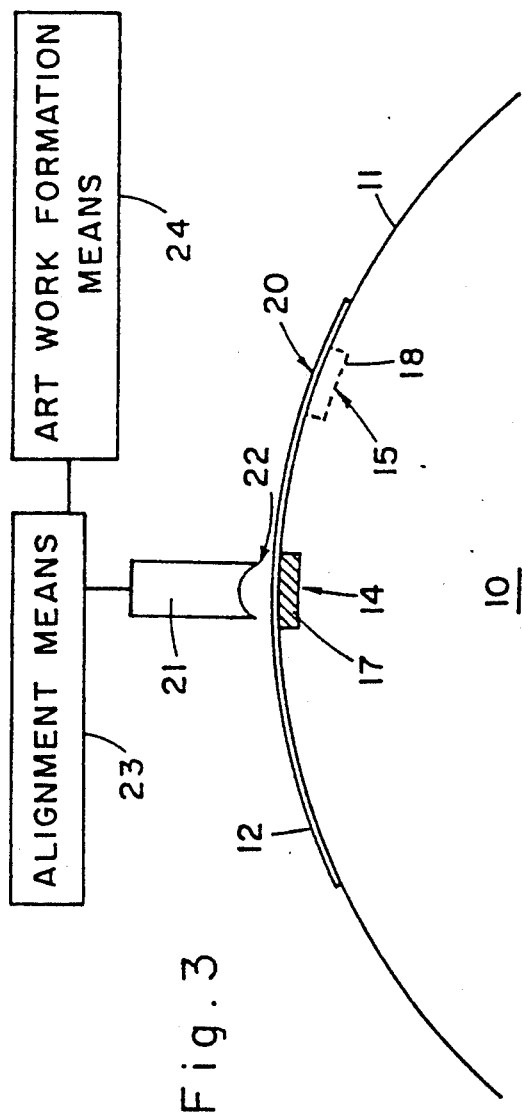
FIG. 3 is a pictorial representation showing a first embodiment according to the invention.

Referring to FIG. 3, there is shown in part-sectional view a first embodiment of a drum plotter according to the invention comprising a cylindrical drum 10, an upper surface of which constitutes a working surface 11 for accommodating thereon a flexible photographic film material 12. An artwork 13 is formed on the film material in precise registration with an origin O (see FIG. 4) of the working surface 11. It will be appreciated that since the film material 12 is secured to the working surface 11 prior to forming the artwork 13 thereon, no special alignment of the film material 12 with the working surface 11 is required.

The manner in which the artwork 13 is formed is not itself a feature of the invention since this is well known in the art. Typically, the artwork 13 is digitized and stored in a CAD database so that each polygon in the artwork is stored digitally in the CAD database with respect to an arbitrary origin of the artwork. A plotter is coupled to the CAD database for reading the digitized artwork data and has at least one writing head responsive to the artwork data for moving to a required coordinate on the surface of the plotter in accordance with the relative coordinate of the artwork data relative to the arbitrary artwork origin.

Typically, the arbitrary artwork origin coincides with the origin O of the plotter although this is not mandatory, it being merely required that there exist a known and predetermined offset between the artwork origin and the origin O of the plotter.

The film material 12 is secured to the working surface 11 of the plotter and the artwork 13 is then plotted in precise registration with the origin O of the plotter. Normally, the offset between the arbitrary origin of the artwork and the plotter origin O is zero, in which case the origin of the artwork 13 corresponds to the origin O of the plotter.

Formed within the drum 10 and flush with the working surface 11 thereof is a plurality of sockets of which two are shown, designated 14 and 15, each corresponding to a hole required to be punched through the photographic film 12. Disposed within the sockets 14 and 15 are blocks 17 and 18 formed of a plastics material.

Mounted adjacent an uppermost surface 20 of the sheet material 12 is a punch 21 having a cutting surface 22 which is smaller than an uppermost surface of the sockets 14 and 15 adjacent to the working surface 11 of the drum 10 (and constituting an operating surface of the sockets). The punch 21 is operably coupled to an alignment means 23 for displacing the punch 21 relative to the working surface 11 of the drum 10 to a predetermined position wherein the punch 21 is substantially aligned with one of the sockets 14 or 15.

The operation of the system is as follows. The artwork 13 is plotted in conventional manner by means of an artwork formation means 24 operatively coupled to the alignment means 23 as explained above. Thereafter, without removing the film 12 from the working surface 11 of the plotter, the punch 21 is substantially aligned with one of the sockets 14 or 15 such that the operating surface of the respective socket completely overlaps the cutting surface 22 of the punch 21.

A displacing means (not shown) coupled to the punch 21 then operates so as to displace the punch 21 axially under impact towards the corresponding socket 14 or 15, thereby penetrating the film 12 and forming a hole therein. In such an arrangement, when the punch 21 is displaced under impact towards the socket 14 or 15, the plastics material 17 or 18 within the socket distorts under the impact, allowing a clean hole to be punched through the film 12.

The arrangement shown pictorially in FIG. 3 employs a single punch 21 which must be aligned successively with each socket in turn until all the registration holes have been formed in the film.

It will be noted that the sockets 14 and 15 are formed with the drum 10 and are thus inevitably precisely aligned with the working surface 11 of the plotter. Consequently, the sockets 14 and 15 are precisely aligned with respect to the origin O of the plotter and therefore also with the arbitrary artwork origin in relation to which the CAD database was previously digitized. As a result, aligning the punch 21 with each of the sockets 14 and 15, in turn, ensures that the punch 21 is also aligned with respect to the origin of the artwork 13. No special steps are needed to provide the required registration since the required alignment is guaranteed by the very fact that the sockets 14 and 15 are themselves disposed within the working surface 11 of the plotter and are therefore already in precise registration with the origin O of the plotter.

It will therefore also be apparent that the order in which the artwork 13 is plotted and the holes are punched is interchangeable. Specifically, although in the process as described above the artwork 13 is plotted first and the holes are punched thereafter, there is no reason why the holes should not be punched before the artwork 13 is plotted. This follows from the fact that in either case the sockets 14 and 15 are in preregistered alignment with the origin O of the plotter and hence with the artwork origin. Therefore, in the event that the holes are punched first, they will still be in precise registration with the origin O of the plotter. Since the artwork 13 is then plotted in precise registration with the same origin O of the plotter, it will inevitably also be in correct registration with respect to the pre-punched holes.

There will now be described with reference to FIG. 4 of the drawings an alternative arrangement for producing three registration holes through a film 25 mounted on a working surface 26 of a drum 27 and employing three punches 28, 29 and 30. The punches 28, 29 and 30 are pre-aligned parallel to a longitudinal axis 32 of the drum 27 with corresponding sockets 34, 35 and 36 formed in the working surface 26 of the drum 27. Disposed within each of the sockets 34, 35 and 36 is a corresponding block 38, 39 and 40, each formed of a plastics material and having an operating surface larger than the corresponding cutting surfaces of the respective punches 28, 29 and 30.

In use, the drum 27 is rotated about the axis 32 until the sockets 34, 35 and 36 are aligned with the respective punches 28, 29 and 30, their operating surfaces completely overlapping the cutting surfaces of the respective punches. Thereafter, the punches are displaced under impact towards the sockets so as to deform the blocks within the sockets, thereby producing a clean hole through the film 25.

Figure 4:
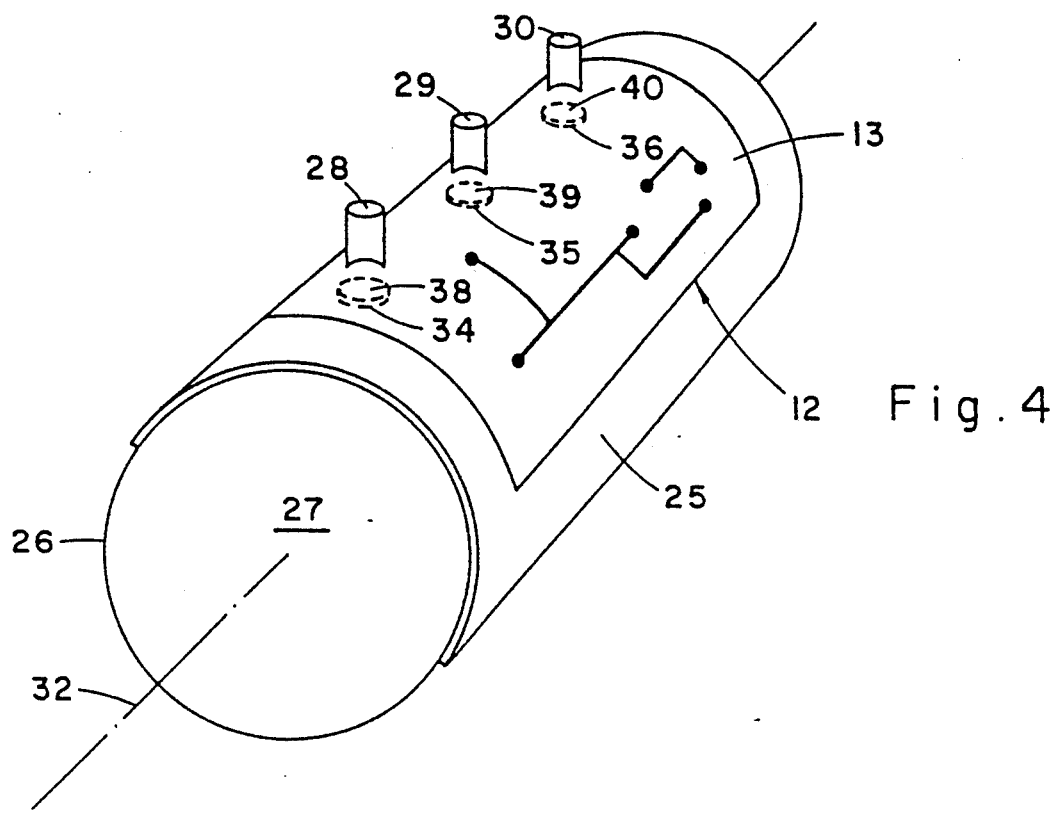
FIG. 4 is a pictorial representation showing in perspective a practical arrangement relating to the first embodiment shown in FIG. 3.

In FIG. 4 the sockets 34, 35 and 36 are shown as being substantially aligned in a direction parallel to the longitudinal axis 32 of the drum 27. However, it will be understood that this need not necessarily be the case and, in general, it is merely desirable that each of the punches 28, 29 and 30 be pre-aligned with the corresponding sockets 34, 35 and 36, either in a direction parallel to the longitudinal axis 32 of the drum 27 or, alternatively, along an axis perpendicular thereto.

For drum plotters, it is preferable that the punches 28, 29 and 30 be substantially aligned, as shown, so as to be operable by a single displacing mechanism coupled thereto. However, when flat-bed plotters are employed, optimal registration with guaranteed repeatability can most satisfactorily be achieved by aligning each of the punches with corresponding sockets along two mutually perpendicular directions. Such an approach is theoretically possible with drum plotters also, but would require separate displacing mechanisms, operating in different planes, in respect of each of the punches.

In all cases, the artwork may be plotted either before or after the holes are punched, the only condition being that the film remains secured to the drum during both operations.

Figure 5:
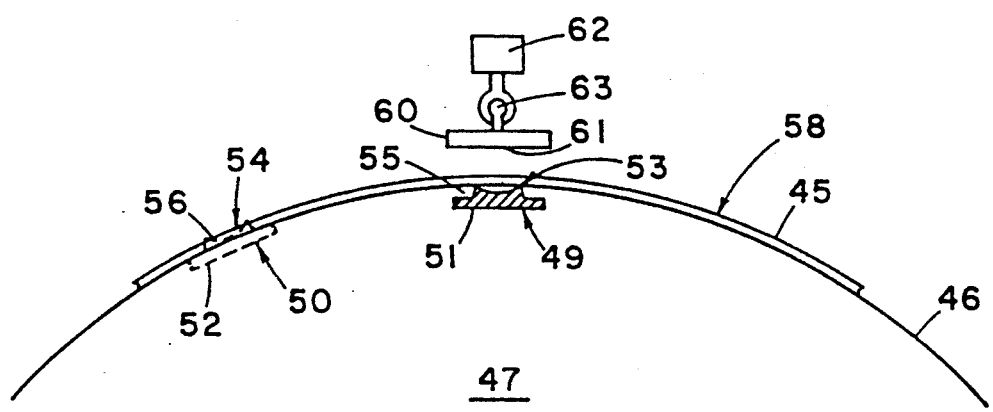
FIG. 5 is a pictorial representation of a second embodiment according to the invention.

Referring now to FIG. 5 of the drawings, there is shown in part-sectional view a second embodiment according to the invention for punching holes through a film 45 mounted on a working surface 46 of a rotating drum 47. Formed within the drum 47 is a plurality of sockets of which two are shown, designated 49 and 50. For the sake of clarity, it is assumed that the two sockets 49 and 50 are not aligned and that the socket marked 50 is not within the section-plane denoted by crosshatching. Mounted in each of the sockets 49 and 50 is a respective punch 51 and 52, each having a respective cutting surface 53 and 54 protruding above the working surface 46 of the drum 47. Thus, the film 45 bulges slightly at the areas marked 55 and 56 where it overlaps the respective punches 51 and 52. However, it should be noted that the bulges 55 and 56 are only very slight, since the amount of protrusion itself is small and, in any case, is insignificant seeing that no artwork is printed on the photographic film 45 in the vicinity of the registration holes to be punched by the respective punches 51 and 52.

Mounted adjacent an uppermost surface 58 of the film 45 is a block 60 formed of aluminum and having an operating surface 61 greater than the cutting surfaces 53 and 54 of the corresponding punches 51 and 52. The block 60 is operatively coupled to a displacing means designated generally as 62 via a ball and socket joint 63.

In operation, the drum 47 is rotated until the block 60 is approximately aligned with each of the sockets 49 and 50, in turn, the operating surface of the block 60 completely overlapping the respective cutting surfaces 53 and 54 of the punches 51 and 52. The displacing means 62 is then operated so as to apply a uniform pressure to the block 60 towards the corresponding punch 51 or 52, whereby the punch 51 or 52 penetrates the film 45 so as to form a hole therethrough.

If, alternatively, the block 60 is formed of plastics, then an impact must be applied to the displacing means 62 so that the plastics material of the block 60 will deform as explained above with reference to FIGS. 3 and 4 of the drawings.

It will be appreciated that in the arrangement shown in FIG. 5, only approximate alignment of the block 60 with each of the punches 51 and 52 is required, the only requirement being that the operating surface 61 of the block 60 completely overlaps the cutting surfaces 53 and 54 of the corresponding punches 51 and 52. This requirement is met in practice using comparatively simple registration means permitting registration holes to be produced at high accuracy and repeatability with low cost.

Such an embodiment guarantees that the holes are punched in precise registration with the artwork since, regardless of whether the artwork is plotted before or after the holes are punched, both operations are performed without removing the film material from the working surface of the drum. Moreover, since the punches themselves are disposed within the working surface of the plotter, an extremely high degree of both registration and repeatability can very easily be ensured.

It will be understood that whilst, in the preferred embodiment, the alignment between the block 60 and each punch 50 and 51 is effected by rotating the drum 47, it is equally possible for the drum 47 to remain stationary and for the alignment to be effected by displacing the block 60 with respect thereto.

FIG. 6 shows in part-sectional elevation a third embodiment similar to the second embodiment described above with reference to FIG. 5 of the drawings. The second and third embodiments are identical in all respects except with respect to the displacing means 62 and to this extent identical reference numerals are employed in the two figures.

Thus, the displacing means 62 shown in FIG. 6 includes a roller 65 permanently in contact with the working surface 46 of the drum 47. In operation, the drum 47 rotates whereby the roller 65 passes over the respective cutting surfaces 53 and 54 of the punches 51 and 52. The rotation of the drum 47 itself causes a uniform pressure to be applied by the corresponding punch 51 or 52 towards the roller 65 through the photographic film 45, whenever the protruding cutting surfaces 53 and 54 pass under the roller 65. In this manner the punch 51 or 52 penetrates the film 45 so as to form a hole therethrough.

In such an arrangement the displacing means 62 remains stationary, the cutting operation being effected directly by rotation of the drum 47, no displacement of the displacing means 62 being required. The time taken to punch the holes is therefore faster than in the second embodiment wherein, after alignment of the block with the punches 51 and 52, the displacing means 62 must be actuated.

Although the preferred embodiments relate specifically to cylindrical drum plotters, it will be appreciated that the invention is equally applicable to flat bed plotters also. In this case, the sockets or punches are formed within the flat working surface of the plotter and in all other respects the operation of the system is identical to that described above with respect to drum plotters. It will be appreciated that in this case no heavy punch and die arrangement need be integrally coupled to the flat bed plotter as is required in hitherto proposed systems relating to flat bed plotters.

Although, from considerations of dynamics, this feature is of greater importance to high speed drum plotters than to flat bed plotters which move at relatively low speed, it still permits the design of the plotter to be greatly simplified. Particularly in the case where the punches are disposed within the working surface of the plotter, precise registration between the artwork and the holes is guaranteed in a system which is both simple and cost effective.

We claim:

1. In a process for forming an artwork on a sheet material, a method for punching holes in the sheet material whilst disposed on a working surface in precise registration with the artwork, the method comprising the steps of:
   (a) providing for each hole to be punched a corresponding socket in said working surface,
   (b) securing the sheet material on the working surface so as completely to overlap all of the sockets,
   (c) forming the artwork on the sheet material in precise registration with a predetermined origin of the working surface,
   (d) associating with each of the sockets a punch and block combination comprising a punch mounted within the socket having a cutting surface which protrudes slightly above the working surface and a block disposed on an opposite surface of the sheet material to the socket, said block being formed of a softer material than the punch and having an operating surface larger than the cutting surface of the punch,
   (e) for each of said punch and block combinations, aligning the punch with the block so that the operating surface of the block completely overlaps the cutting surface of the punch, and
   (f) effecting relative axial displacement of the punch towards the block aligned therewith so as to punch a hole through the sheet material in precise registration with the artwork.

2. The method according to claim 1, wherein a single block is successively aligned with each punch.

3. The method according to claim 1, further including the steps of:
   (g) removing the artwork from the working surface, and
   (h) mounting the artwork on an independent registration system having therein registration pins for registering with corresponding ones of the holes in the sheet material, whereby two or more separate artworks each formed in precise registration with said origin may be subsequently mounted on the registration system in precise registration with each other.

4. In a process for forming an artwork on a sheet material, a method for punching holes in the sheet material whilst disposed on a cylindrical working surface in precise registration with the artwork, the method comprising the steps of:
   (a) providing for each hole to be punched a corresponding socket in said working surface,
   (b) securing the sheet material on the working surface so as completely to overlap all of the sockets,
   (c) associating with each of the sockets a punch and block combination disposed on opposite surfaces of the sheet material, said block being formed of a softer material than the punch and having an operating surface larger than a cutting surface of the punch,
   (d) for each of said punch and block combinations, aligning the punch with the block so that the operating surface of the block completely overlaps the cutting surface of the punch, and
   (e) effecting relative axial displacement of the punch towards the block aligned therewith so as to punch a hole through the sheet material in precise registration with a predetermined origin of the working surface, and
   (f) forming the artwork on the sheet material in precise registration with said origin.

5. The method according to claim 1, wherein the working surface is cylindrical.

6. A system for forming an artwork on a sheet material and punching registration holes therethrough, the system comprising:

a working surface having embedded therein a socket in respect of each registration hole to be punched and having associated therewith a predetermined origin, a sheet material secured on to the working surface so as completely to overlap all of the sockets, artwork formation means for forming the artwork on the sheet material in precise registration with the origin of the working surface, a punch and block combination associated with each of the sockets comprising a punch mounted within the socket and having a cutting surface which protrudes slightly above the working surface and a block disposed on an opposite surface of the sheet material to said punch, said block being formed of a relatively soft material compared to the cutting surface of the punch and having an operating surface larger than the cutting surface of the punch, alignment means operatively coupled to the punch and block combination for aligning each punch relative to its respective block so that the operating surface of the block completely overlaps the cutting surface of the punch, and displacing means coupled to each punch and block combination for displacing the cutting surface of the corresponding punch through the sheet material.

7. The system according to claim 6, wherein for each punch and block combination the block is mounted within the corresponding socket so that the operating surface of the block is substantially flush with the working surface.

8. The system according to claim 6, wherein for each punch and block combination the punch is mounted within the corresponding socket so that the cutting surface protrudes slightly above the working surface.

9. The system according to claim 6, wherein the working surface is cylindrical.

10. The system according to claim 6, wherein the alignment means is coupled to only a single punch for successively aligning said single punch with each of the blocks.

11. The system according to claim 6, wherein for each punch and block combination:
the block is formed of an elastic material, and
the displacing means impacts the block.

12. The system according to claim 6, wherein for each punch and block combination:
the block is formed of metal, and
the displacing means applies pressure to the block.

13. The system according to claim 6, wherein:
the working surface is a cylindrical drum,
a single block is provided in respect of all of the punch and block combinations permanently in contact with the working surface of the drum, and
the aligning means and displacing means are integrally coupled for rotating the drum so as to cause the cutting surface of each punch to overlap the operating surface of the block consequent to rotation of the drum and to be pressed through the sheet material towards the operating surface of the block.

14. The system according to claim 6, wherein for each punch and block combination the punch and block are substantially pre-aligned along at least one axis in the plane of the working surface intersecting a center of the corresponding socket.

15. In a process for forming an artwork on a sheet material, a method for punching holes in the sheet material whilst disposed on a working surface in precise registration with the artwork, the method comprising the steps of:

(a) providing for each hole to be punched a corresponding socket in said working surface, (b) securing the sheet material on the working surface so as completely to overlap all of the sockets, (c) forming the artwork on the sheet material in precise registration with a predetermined origin of the working surface, (d) associating with each of the sockets a punch and block combination comprising a block mounted within the socket and a punch disposed on an opposite surface of the sheet material to the socket, said block being formed of a softer material than the punch and having an operating surface which is substantially flush with the working surface and is larger than a cutting surface of the punch, (e) for each of said punch and block combinations, aligning the punch with the block so that the operating surface of the block completely overlaps the cutting surface of the punch, and (f) effecting relative axial displacement of the punch towards the block aligned therewith so as to punch a hole through the sheet material in precise registration with the artwork.

16. The method according to claim 15, further including the steps of:

(g) removing the artwork from the working surface, and (h) mounting the artwork on an independent registration system having therein registration pins for registering with corresponding ones of the holes in the sheet material, whereby two or more separate artworks each formed in precise registration with said origin may be subsequently mounted on the registration system in precise registration with each other.

17. The method according to claim 15, wherein a single punch is successively aligned with each block.

18. The method according to claim 15, wherein the working surface is cylindrical.

19. A system for forming an artwork on a sheet material and punching registration holes therethrough, the system comprising:

a working surface having embedded therein a socket in respect of each registration hole to be punched and having associated therewith a predetermined origin, a sheet material secured on to the working surface so as completely to overlap all of the sockets, artwork formation means for forming the artwork on the sheet material in precise registration with the origin of the working surface, a punch and block combination associated with each of the sockets comprising a block mounted within the socket and a punch disposed on an opposite surface of the sheet material to said block, said block being formed of a relatively soft material compared to a cutting surface of the punch and having an operating surface which is substantially flush with the working surface and is larger than the cutting surface of the punch, alignment means operatively coupled to the punch and block combination for aligning each punch relative to its respective block so that the operating surface of the block completely overlaps the cutting surface of the punch, and displacing means coupled to each punch and block combination for displacing the cutting surface of the corresponding punch through the sheet material.

20. The system according to claim 19, wherein for each punch and block combination the punch and block are substantially pre-aligned along at least one axis in the plane of the working surface intersecting a center of the corresponding socket.

21. The system according to claim 19, wherein the working surface is cylindrical.

22. The system according to claim 19, wherein the alignment means is coupled to only a single block for successively aligning said single block with each of the punches.

23. The system according to claim 19, wherein for each punch and block combination:
the block is formed of an elastic material, and
the displacing means impacts the block.

24. The system according to claim 19, wherein for each punch and block combination:
the block is formed of metal, and
the displacing means applies pressure to the block.

* * * * *